United States Patent
Hutchison et al.

(10) Patent No.: US 6,310,772 B1
(45) Date of Patent: Oct. 30, 2001

(54) ENCLOSURE FOR TELECOMMUNICATIONS EQUIPMENT

(75) Inventors: Randy Hutchison, Shawnee; Robert Shiffbauer, Olathe, both of KS (US)

(73) Assignee: Special Product Company, Overland Park, KS (US)

( * ) Notice: Subject to any disclaimer, the term of this patent is extended or adjusted under 35 U.S.C. 154(b) by 0 days.

(21) Appl. No.: 09/388,691

(22) Filed: Sep. 2, 1999

(51) Int. Cl.⁷ ....................................................... H05K 7/20
(52) U.S. Cl. ........................................ 361/700; 165/104.33
(58) Field of Search ............................ 312/236; 174/15.2; 165/80.3, 104.33; 454/184; 455/128; 347–349; 361/689, 690, 692, 699, 700, 703, 717–719, 796, 797; 62/259.2

(56) References Cited

U.S. PATENT DOCUMENTS

| | | |
|---|---|---|
| 4,449,576 * | 5/1984 | Baum . |
| 4,465,899 * | 8/1984 | Mauclere . |
| 4,679,250 * | 7/1987 | Davis . |
| 5,329,425 * | 7/1994 | Leyssens . |
| 5,343,358 * | 8/1994 | Hilbrink . |
| 5,777,846 * | 7/1998 | Hayes . |
| 5,842,514 * | 12/1998 | Zapach . |
| 5,844,777 * | 12/1998 | Gates . |
| 5,896,268 * | 4/1999 | Beavers . |
| 5,949,650 * | 9/1999 | Bulante . |
| 6,055,157 * | 4/2000 | Bartilson . |
| 6,104,611 * | 8/2000 | Glover . |
| 6,118,662 * | 9/2000 | Hutchison . |

OTHER PUBLICATIONS

Thermacore Inc. sales brochure, "heat pipes for electronics cooling applications", 4 pages.
Thermacore Inc. Product Data Guide, "Miniature Heat Pipes," Sep. 24, 1996, 1 page.
Thermacore Inc. brochure, "Common Questions About Heath Pipes," Sep. 23, 1996, 2 pages.
Thermacore Inc. sales brochure, "The Leader in Heath Pipe Technology", 4 pages.

* cited by examiner

Primary Examiner—Gerald Tolin
(74) Attorney, Agent, or Firm—Hovey, Williams, Timmons & Collins

(57) ABSTRACT

An enclosure (10) for protecting and dissipating heat from electronic equipment such as telecommunications repeater cards (12). The enclosure includes: exterior walls defining a substantially enclosed chamber (14); at least one shelf (16) positioned within the chamber for holding a plurality of repeater cards, the shelf including spaced apart top and bottom walls (60, 62) configured for receiving the cards therebetween and for making direct contact with the cards to allow conduction of heat to the top and bottom walls from the cards; a plurality of elongated heat pipes (84) each having a first, proximal end (84a) coupled with the top or bottom wall for conducting heat to the heat pipe from the top or bottom wall, the heat pipes also each having a second, distal end (84b); and at least one fin (86) coupled with the second, distal end of each of the heat pipes for conducting heat to the fin from the heat pipes so that the heat may be convected from the fin to ambient air in the chamber.

4 Claims, 3 Drawing Sheets

ENCLOSURE FOR TELECOMMUNICATIONS EQUIPMENT

BACKGROUND OF THE INVENTION

1. Field of the Invention

The present invention relates to enclosures for protecting and dissipating heat from electronic equipment such as telecommunications repeaters. More particularly, the invention relates to such an enclosure that effectively dissipates heat in a passive manner and that is lightweight, inexpensive, space efficient and durable enough to be used in any applications.

2. Description of the Prior Art

The ever-increasing use of the internet, wide area networks, and other networks has increased the demand for high-speed, high-bandwidth digital telecommunications services such as ISDN, DSL, and T1 services in homes and businesses. Because of signal propagation limitations, these digital services require the use of repeaters to repeat digital signals if the end users are too far from their provider's central office.

The repeaters used for these digital services are typically housed in protective enclosures that are mounted to telephone poles or placed next to buildings or in manholes. The enclosures must be designed to protect the repeaters from natural elements such as sun, rain, snow, and fire as well as damage from vandalism and attempted theft.

Just as importantly, the enclosures must be designed to dissipate excess heat generated by electronic components of the repeaters. All electronic components generate heat that must be dissipated to ensure optimum and reliable operation. Such heat dissipation has become increasingly more difficult as electronic components have become faster, more powerful, and smaller, and therefore hotter. Further compounding these heat dissipation problems is that telecommunications enclosures are typically not connected to electricity sources and therefore cannot rely on fans or other active cooling elements. The enclosures therefore must be designed to dissipate heat passively by conduction and convection to ambient air, which can frequently reach temperatures of well over 100° F., especially when the enclosures are exposed to direct sunlight.

In addition to weather protection and heat dissipation requirements, it is also desirable that telecommunications enclosures be lightweight, space efficient, and inexpensive.

Prior art telecommunication enclosures attempt to passively dissipate heat with heat sink methods. However, heat sinks are limited in their heat dissipation capabilities and are large and heavy, thus increasing the overall size and weight of the enclosures.

There is therefore a need for an improved telecommunications enclosure that protects repeaters and other electronics from exposure to weather conditions and damage from vandalism and that more effectively dissipates excess heat from the electronic components in a passive manner. There is also a need for such an enclosure that is relatively lightweight, space efficient, and inexpensive.

OBJECTS AND SUMMARY OF THE INVENTION

The present invention solves the above-described problems and provides a distinct advance in the art of telecommunications enclosures. More particularly, the present invention provides a telecommunications enclosure that protects repeaters and other electronics from exposure to weather conditions and damage from vandalism, that more effectively dissipates excess heat from the electronic components in a passive manner, and that is relatively lightweight, space efficient, and inexpensive.

The telecommunications enclosure of the present invention broadly includes: exterior walls defining a substantially enclosed chamber; at least one shelf positioned within the chamber for holding a plurality of repeater cards, the shelf including spaced apart top and bottom walls configured for receiving the cards therebetween and for making direct contact with the repeater cards to allow conduction of heat to the top and bottom walls from the repeater cards; a plurality of elongated heat pipes each having a first, proximal end coupled with the top or bottom wall for conducting heat to the heat pipe from the top or bottom wall, the heat pipes also each having a second, distal end; and at least one fin coupled with the second, distal end of each of the heat pipes for conducting heat to the fin from the heat pipes so that the heat may be convected from the fin to ambient air in and around the chamber.

In use, repeater cards or other electronic cards are placed on the shelf so that they make direct metal-to-metal contact with the shelf. As heat is generated by the electronics on the cards, the heat is dissipated to the card housings by conduction and/or convection, and is in turn conducted and/or convected to the shelf top and bottom walls. The shelf top and bottom walls then conduct the heat to the heat pipes, which in turn conduct the heat to the fins. The fins dissipate the heat through convection to the ambient air in and around the chamber. This combination of heat dissipation through conduction and convection effectively removes excess heat from the cards.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figure 1:
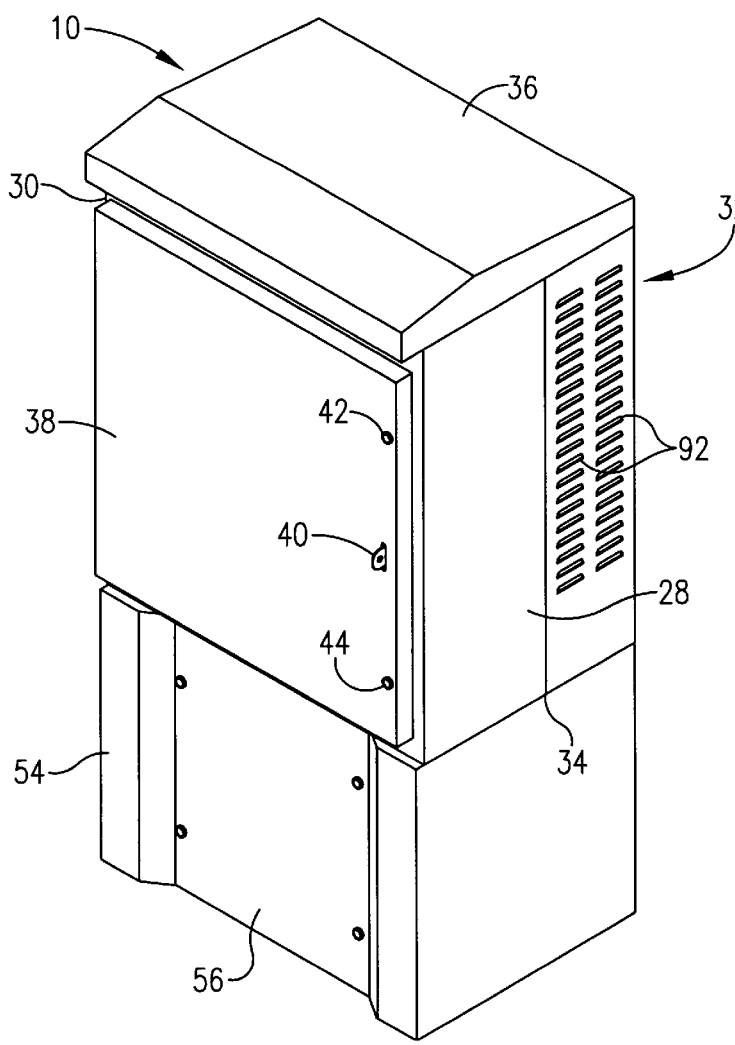
FIG. 1 is a perspective view of a telecommunications enclosure constructed in accordance with a preferred embodiment of the present invention.
Figure 3:
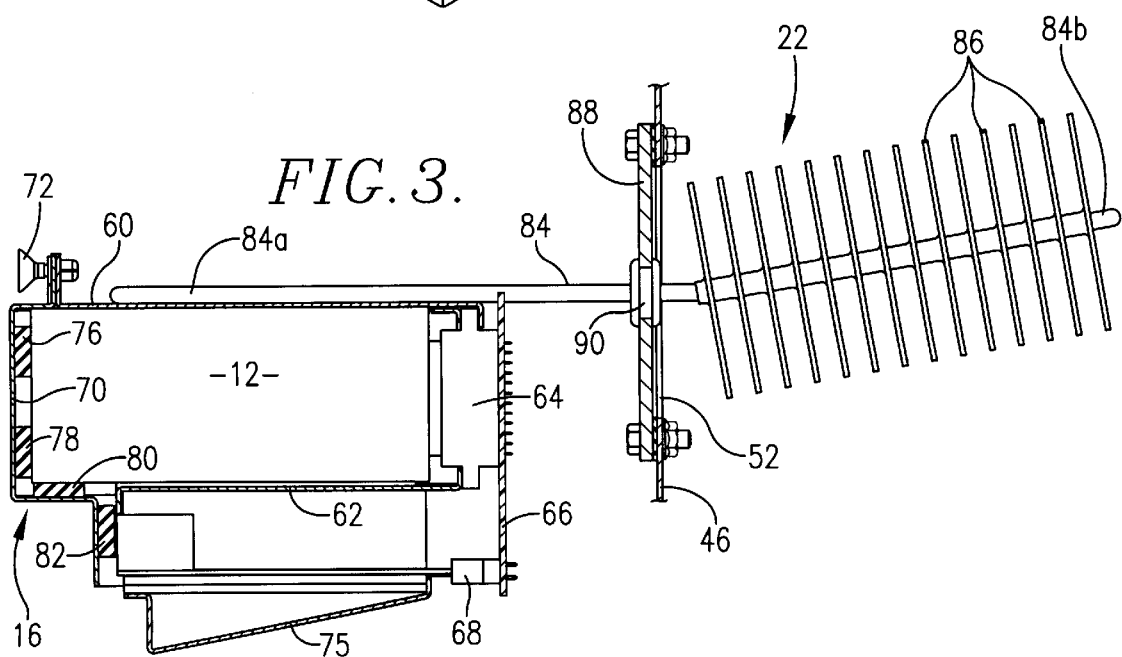
FIG. 3 is a side sectional view of one of the shelves and gas tube assemblies of the telecommunications enclosure.

Turning now to FIG. 1, a telecommunications enclosure 10 constructed in accordance with a preferred embodiment of the invention is illustrated. The enclosure is configured for housing electronics such as the telecommunications repeater cards 12 illustrated in FIGS. 2 and 4 to protect the cards from exposure to weather conditions and damage from vandalism and to dissipate excess heat from the cards.

The enclosure 10 broadly includes exterior walls defining a substantially enclosed inner chamber 14, a plurality of shelves 16, 18, 20 positioned within the chamber for holding the repeater cards 12, and a plurality of heat pipe assemblies 22, 24, 26, each coupled with one of the shelves.

In more detail, the enclosure includes a pair of spaced apart sidewalls 28, 30, a back wall 32, a bottom wall 34, a sloped cover 36, and a hinged door 38 that together define the enclosed inner chamber 14. The hinged door may be locked by inserting a lock through an eyelet type latch 40 that extends through a slot in the door when it is closed as illustrated in FIG. 1. The door may further be locked shut by a pair of lock-type screws 42, 44.

Figure 2:
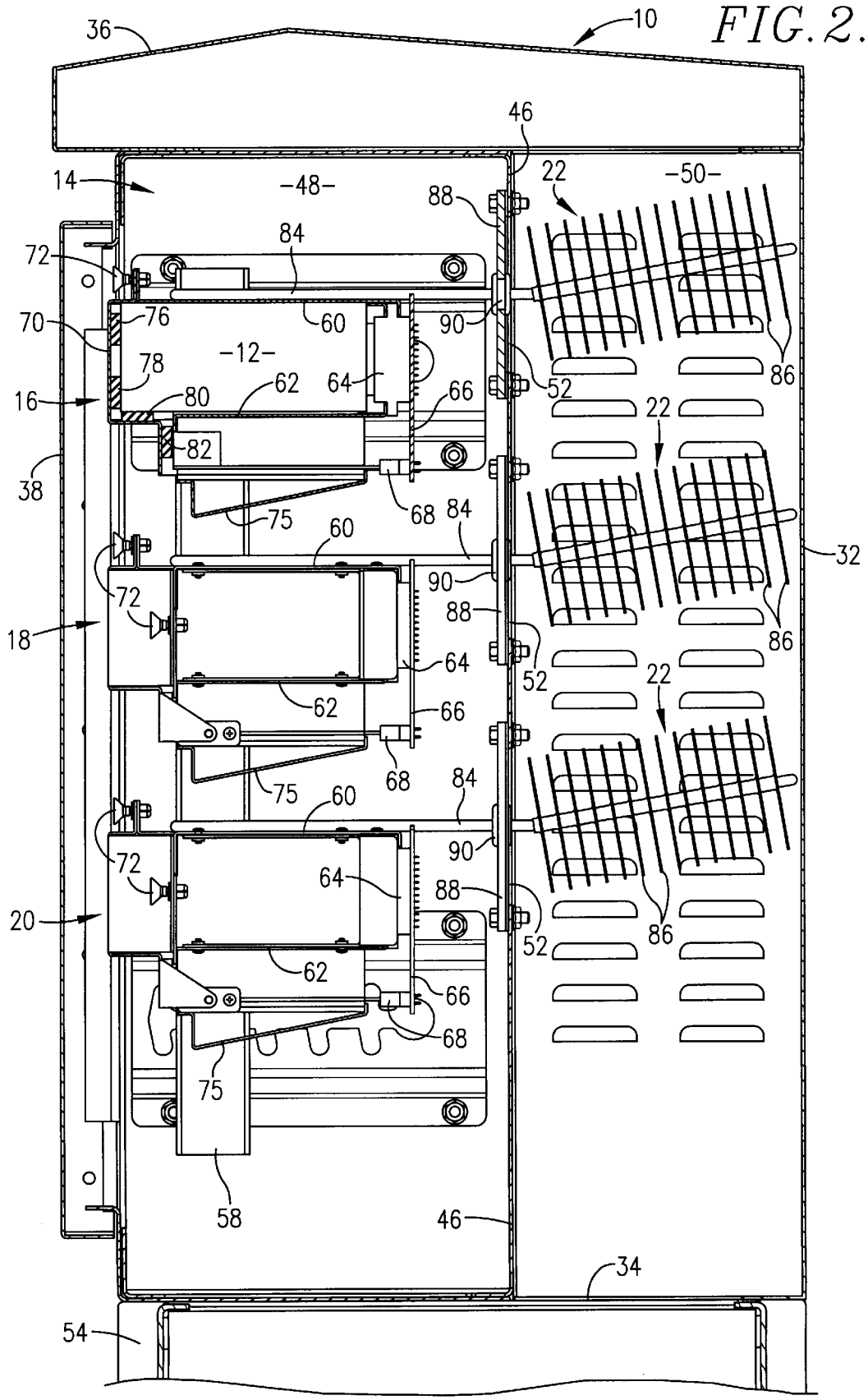
FIG. 2 is a vertical side sectional view of the enclosure of FIG. 1.

As best illustrated in FIG. 2, the enclosure also preferably includes a vertically extending inner wall 46 that subdivides the chamber 14 into front and rear chamber sections 48, 50. The inner wall has a series of vertically spaced oval-shaped openings 52 therein, the purpose of which is described below.

The enclosure 10 is preferably mounted on top of a base 54 or stand that elevates the enclosure off the ground so that the cards 12 housed therein are not exposed to standing water or debris that may accumulate around the base. The base also provides a conduit or raceway area for routing wires therethrough to be connected to the cards. The base preferably has a removable front access panel 56 that permits access to the wiring routed therethrough. The enclosure may also be configured for mounting to a telephone pole or in a manhole or any other suitable structure.

The enclosure 10 and base 54 as well as their internal components are all preferably formed of stainless steel and/or aluminum unless noted otherwise herein. A preferred embodiment of the enclosure measures approximately 48 inches high including the base, 18 inches deep, and 24 inches wide.

As best illustrated in FIG. 2, the shelves 16, 18, 20 are vertically spaced within the enclosure and are mounted to an upright channel 58 or support that is bolted or otherwise attached to one of the sidewalls of the enclosure. The shelves are configured for receiving and holding the repeater cards 12 or other electronic cards. The enclosure preferably includes three substantially identical shelves; however, any number of shelves of any configuration may be provided as a matter of design choice.

Each shelf 16, 18, 20 includes spaced apart top and bottom walls 60, 62 defining a plurality of card-receiving slots for receiving and holding the repeater cards. The upper wall is preferably formed of copper to increase its thermal conductivity. Each shelf is preferably configured for holding 9 standard double-wide 5½ watt cards or 18 standard single-wide 3½ watt cards or any other combinations of cards and watts. Each of the cards includes an outer protective metal housing.

The top and bottom shelf walls 60, 62 are spaced apart a distance that is selected so that the cards 12 fit snugly therebetween and make direct metal-to-metal contact with the walls. This direct metal-to-metal contact allows heat to pass via conduction from the electronic components on the cards to the shelf walls. Each card plugs into an electrical connecter 64 connected to a circuit board 66 positioned behind its respective shelf. The circuit board is in turn connected to wiring 68 that connects with telecommunications cabling entering the enclosure through the base or stand.

Figure 4:
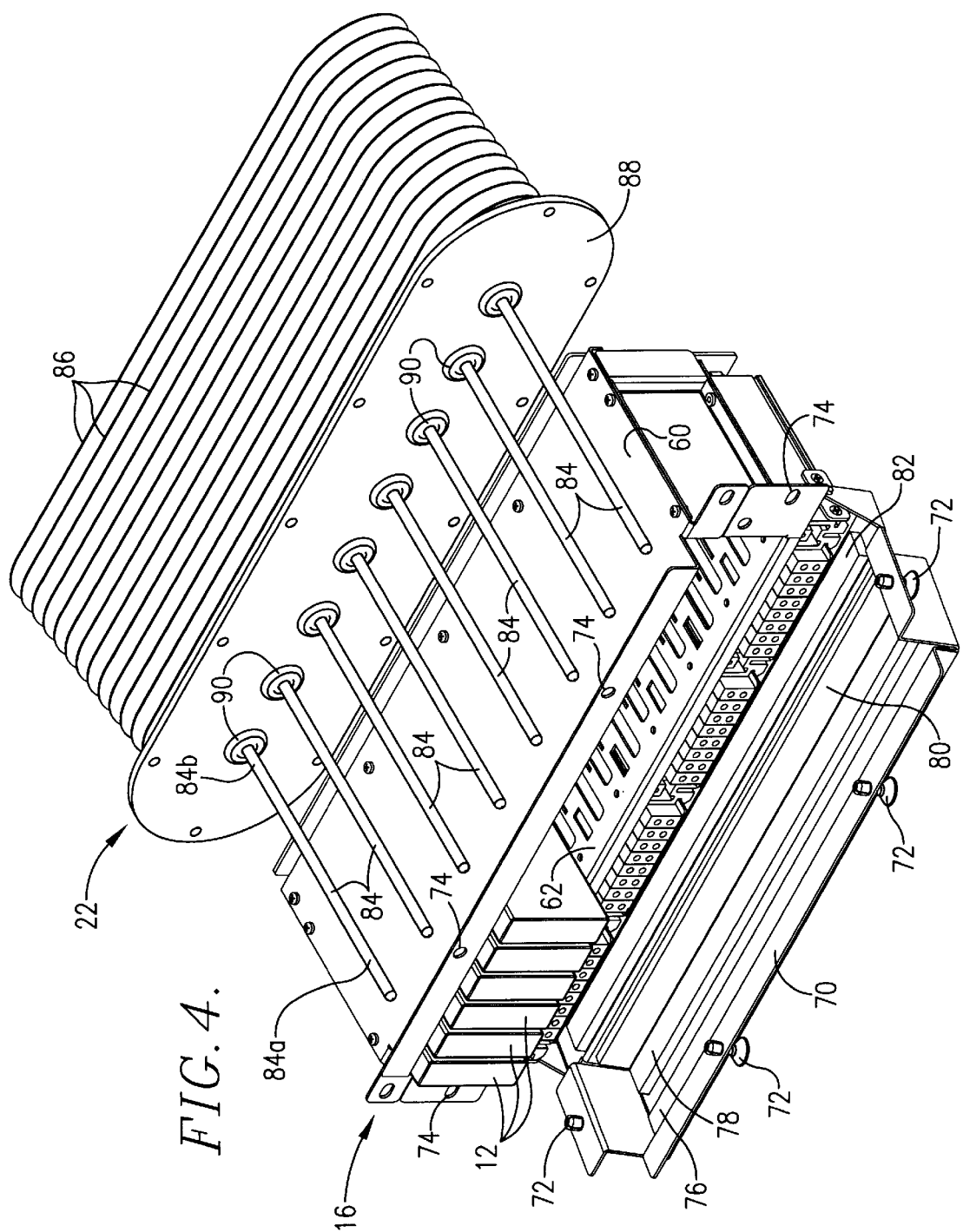
FIG. 4 is a perspective view of one of the shelves and gas tube assemblies of the telecommunications enclosure depicting the placement of several repeater cards within the shelf.

As best illustrated in FIG. 4, each shelf 16, 18, 20 also includes a hinged door 70 for providing access to the card-receiving slots and the cards 12 when opened and for closing the opening between the top and bottom shelf walls 60, 62 when closed. The hinged door preferably includes a plurality of fasteners 72 that can be inserted into corresponding holes 74 on the shelf walls to hold the door in its closed position. A debris pan 75 may be positioned below each shelf to catch objects that may fall from the shelves.

A plurality of foam strips 76, 78, 80, 82 are adhered to the inside face of the hinged doors 70 for biasing the cards 12 rearward and upward when the doors are closed to ensure that the cards are securely inserted into their corresponding electrical connectors and to firmly press the cards into direct contact with the top shelf wall 60. Particularly, the foam strips 76, 78, 82 bias the cards rearward into their electrical connectors 64 and the foam strip 80 lifts the cards upward against the top shelf wall 60 when the hinged door is closed.

As best illustrated in FIG. 4, each heat pipe assembly 22, 24, 26 includes a plurality of elongated heat pipes 84 that are coupled with each shelf for transferring heat therefrom and a plurality of spaced-apart fins 86 mounted to the heat pipes. The heat pipes are evacuated vessels, preferably circular in cross section, that are back-filled with a small quantity of a working fluid such as alcohol or other radiator-type fluid. As heat is input into the proximal, evaporator end 84a of the heat pipes, the fluid is vaporized, creating a pressure gradient in the pipes. This pressure gradient forces the vapor to flow along the pipe to the cooler, distal end 84b of the pipes where it condenses, giving up its latent heat of vaporization. The working fluid is then returned to the proximal, evaporator end of the pipes by capillary forces. The preferred heat pipes are manufactured by Thermacore, Inc. of Lancaster, Pa. As those skilled in the art will appreciate, any number of heat pipes may be used depending upon the amount of heat transfer needed for the particular application. In preferred forms, approximately eight heat pipes are attached to the upper wall of each shelf as illustrated in FIG. 4.

The openings 52 in the inner wall 46 of the enclosure are preferably covered by oval-shaped cover panels 88 that are bolted to the inner wall. The heat pipes 84 extend through grommets 90 positioned along the longitudinal axis of the cover panel as illustrated in FIG. 4. The cover panels and grommets form a substantial airtight seal between the front and rear chamber sections 48, 50 of the enclosure.

The fins 86 are mounted to the cooler, distal ends 84b of the heat pipes 84 so that heat transferred to the heat pipes from the shelves 16, 18, 20 is conducted to the fins and then convected to ambient air in the rear chamber section 50. Any number of fins may be attached to the heat pipes depending on the amount of heat transfer needed for the particular application. In preferred forms, approximately 13 fins, spaced approximately 0.4 to 0.5 inches apart, are attached to the distal ends of the heat pipes.

As illustrated in FIG. 2, the shelves are preferably positioned in the front chamber section 48 of the enclosure, the heat pipes 84 extend through the openings 52 in the inner wall 46 so that they extend into both the front and rear sections 48, 50 of the enclosure, and the fins 86 are positioned in the rear chamber section 50.

A plurality of louvers 92 are preferably formed in the exterior walls of the enclosure proximate the rear chamber section 50 for introducing ambient air into and out of the rear chamber section for aiding in the convection of heat from the fins. Because the cover panels 88 and grommets 90 create a substantially airtight seal between the front end and rear chamber 48,50, the air that circulates around the fins is not introduced into the chamber section containing the cards 12. This prevents dust and other contaminants from reaching the cards.

In use, the repeater cards 12 or other electronic cards are placed into the slots in the shelves 16, 18, 20 of the enclosure as illustrated in FIG. 4. The hinged doors 70 of the shelves are then closed so that the attached foam strips 76, 78, 80, 82 bias the cards rearward and upward so that they make direct metal-to-metal contact with the shelf top and the bottom walls 60, 62 and especially with the top wall 60. As heat is generated by the electronics on the cards, the heat is dissipated to the card housings by conduction and/or convection, and is in turn conducted and/or convected to the top and bottom shelf walls. The shelves then conduct the heat to the heat pipes 84, which in turn conduct the heat to the fins 86. Finally, the fins dissipate the heat through convection to the ambient air in the rear chamber section of the enclosure and to air passing into and out of the louvers.

Having thus described the preferred embodiment of the invention, what is claimed as new and desired to be protected by Letters Patent includes the following:

What is claimed is:

1. An enclosure for protecting telecommunications repeaters from exposure to harmful elements and for dissipating heat generated by the repeaters, the enclosure comprising:

exterior walls defining a substantially enclosed chamber and an interior wall positioned within the chamber for dividing the chamber into front and rear chamber sections;

a shelf positioned within the chamber for holding a plurality of repeater cards, the shelf including spaced apart shelf walls configured for receiving the cards therebetween and for making direct contact with the repeater cards to allow conduction of heat to the shelf walls from the repeater cards; and a heat pipe assembly coupled with the shelf for conducting heat from the shelf, the heat pipe assembly including plurality of elongated heat pipes that extend through openings formed in the interior wall, the heat pipes having first, proximal ends positioned in the front chamber section and coupled with one of the shelf walls for conducting heat from the shelf wall to the heat pipes and second, distal ends positioned in the rear chamber section, and a fin coupled with the second, distal ends of the heat pipes for conducting heat from the heat pipes to the fin so that the heat may be convected from the fin to ambient air in the rear chamber section.

2. The enclosure as set forth in claim 1, wherein the shelf is positioned within the front chamber section.

3. The enclosure as set forth in claim 1, the exterior walls including louvers formed therein proximate the rear chamber section for introducing ambient air into and out of the rear chamber section for aiding in the convection of heat from the fin.

4. The enclosure as set forth in claim 1, wherein at least one of the shelf walls is formed of copper material for improving conduction of heat to the shelf wall from the repeater cards.

* * * * *

UNITED STATES PATENT AND TRADEMARK OFFICE
CERTIFICATE OF CORRECTION

PATENT NO. : 6,310,772 B1
DATED : October 30, 2001
INVENTOR(S) : Randall Hutchison and Robert Schiffbauer It is certified that error appears in the above-identified patent and that said Letters Patent is hereby corrected as shown below:

<u>Title page,</u>
Item [75], Inventors: delete "Randy" and substitute therefor -- Randall --
Item [75], Inventors: delete "Shiffbauer" and substitute therefore -- Schiffbauer --

Signed and Sealed this

Fifth Day of March, 2002

Attest:

JAMES E. ROGAN
*Attesting Officer*  *Director of the United States Patent and Trademark Office*